United States Patent [19]

Wong

[11] Patent Number: 5,760,651

[45] Date of Patent: Jun. 2, 1998

[54] INDUCTORLESS VOLTAGE BIASING CIRCUIT FOR AND AC-COUPLED AMPLIFIER

[75] Inventor: Stephen L. Wong, Scarsdale, N.Y.

[73] Assignee: Philips Electronics North America Corporation, New York, N.Y.

[21] Appl. No.: 688,463

[22] Filed: Jul. 30, 1996

[51] Int. Cl.$^6$ ............................................. H03F 1/30
[52] U.S. Cl. ............................................. 330/296; 330/290
[58] Field of Search ........................... 330/290, 296, 330/300, 302

[56] References Cited

U.S. PATENT DOCUMENTS

| | | |
|---|---|---|
| 4,849,712 | 7/1989 | Jarrett ........................ 330/290 X |
| 5,345,191 | 9/1994 | Tanaka ........................ 330/290 X |
| 5,432,479 | 7/1995 | Wong ........................ 330/296 |

OTHER PUBLICATIONS

"A Simple Four–Quadrant Analogue Divider", by P. Pampaloni, Electronic Engineering, Jan. 1979, p. 18.

"Active Circuit to Cancel Power Supply Electrical Noise", IBM Technical Disclosure Bulletin, vol. 30, No. 4, Sep. 1987, pp. 1813–1815.

*Primary Examiner*—Steven Mottola
*Attorney, Agent, or Firm*—Steven R. Biren

[57] ABSTRACT

An inductorless voltage biasing circuit is provided for an AC-coupled amplifier of the type having a signal input terminal and a coupling capacitor for coupling the input terminal to a control terminal of the AC-coupled amplifier. The voltage biasing circuit includes a voltage source coupled to the control terminal, with the voltage biasing circuit including a differential-input amplifier having a non-inverting input coupled to the voltage source, an inverting input, an output terminal and a differential voltage gain characteristic that decreases as a function of frequency. A resistor is coupled between the inverting input and the output terminal, and the control terminal of the AC-coupled amplifier is coupled to the inverting input of the differential-input amplifier. In this manner, a low-impedance DC-voltage biasing source is provided for an AC-coupled amplifier without using an inductor.

8 Claims, 2 Drawing Sheets

INDUCTORLESS VOLTAGE BIASING CIRCUIT FOR AND AC-COUPLED AMPLIFIER

BACKGROUND OF THE INVENTION

The invention is in the field of biasing circuits for AC-coupled amplifiers, and relates more particularly to inductorless voltage biasing circuits for such amplifiers.

Biasing for AC-coupled amplifiers may typically be provided either by a current-mode biasing scheme or a voltage-mode biasing scheme. As compared to a current-mode biasing scheme, such as that shown in my U.S. Pat. No. 5,432,479, a voltage-mode biasing scheme is generally preferable because it typically consumes less current, results in increased transistor breakdown voltage, and controls the actual bias current rather than the quiescent current of the circuit.

A typical prior-art voltage-mode biasing scheme is shown in FIG. 1. In the circuit of FIG. 1, an AC-coupled amplifier A such as an RF amplifier is capacitively coupled by capacitors $C_{IN}$ and $C_{OUT}$ between input and output terminals $V_{IN}$ and $V_{OUT}$ respectively with a voltage source $V_B$ being provided to a control terminal of the amplifier through an inductor L. The inductor is needed to provide the desired coupling characteristics, namely a low impedance connection between the source of bias voltage and the amplifier control terminal at DC along with a relatively high impedance in the operating frequency range of the circuit, so that the DC bias voltage from the voltage source $V_B$ is coupled in a loss-free manner to the amplifier, while the amplifier is not loaded down by the biasing circuitry in the operating frequency range of the amplifier. This configuration provides an operationally-efficient solution to the problem of providing biasing voltage without loading down the amplifier circuit, but has the drawback of requiring the use of an inductor, which increases the size and cost of the circuit, and which typically cannot be integrated.

Accordingly, it would be desirable to achieve the advantages of an inductor-coupled voltage-mode biasing scheme for an AC-coupled amplifier with a biasing circuit which does not require the use of an inductor.

SUMMARY OF THE INVENTION

It is therefore an object of the invention to provide a DC voltage biasing circuit for an AC-coupled amplifier which provides the advantages of a voltage-mode biasing scheme and inductive coupling, but without the use of an inductor.

In accordance with the invention this object is achieved in a voltage biasing circuit of the type described above in which a differential-input amplifier with a differential voltage gain function characteristic that decreases as a function of frequency is provided having a noninverting input coupled to the voltage source, an inverting input and an output terminal, in which a resistor is coupled between the inverting input and the output terminal, and in which the control terminal of the amplifier is coupled to the inverting input. In this manner the DC bias voltage of the AC-coupled amplifier is provided without loading down the gain of the AC-coupled amplifier at its operating frequency.

In a preferred embodiment of the invention, the resistor is coupled to the output terminal by either the base-emitter path of a bipolar transistor or by a field effect transistor.

In a further preferred embodiment of the invention, the control terminal is coupled to the inverting input by the base-emitter path of a bipolar transistor.

Biasing circuits in accordance with the present invention offer a significant improvement in that the advantages of a voltage-mode inductive-coupled biasing scheme are obtained without the use of an inductor, thus providing a compact, economical and easily-integrated circuit configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

DESCRIPTION OF THE PREFERRED EMBODIMENTS

Figure 1:
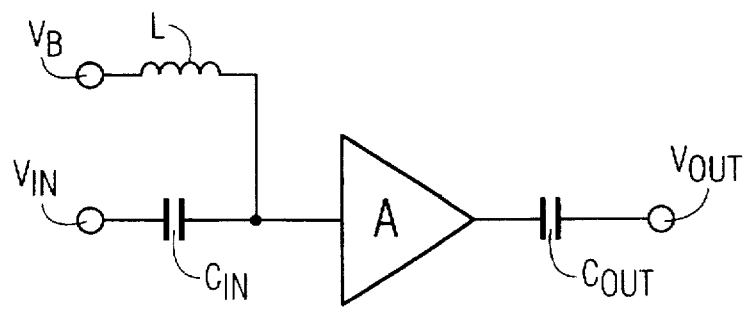
FIG. 1 shows a prior-art inductively-coupled voltage biasing circuit in simplified form.
Figure 2:
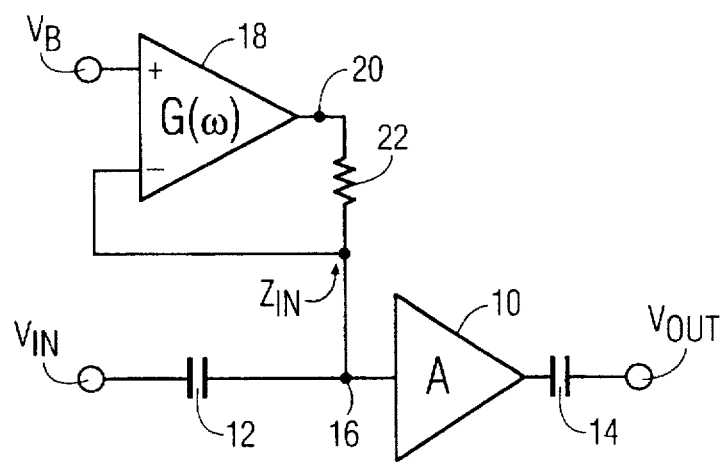
FIG. 2 shows an inductorless voltage biasing circuit in accordance with a first embodiment of the invention.

In order to achieve the advantages of an inductor-coupled voltage-mode biasing scheme for an AC-coupled amplifier such as that shown in prior-art FIG. 1, but without the use an inductor, an inductorless voltage-mode biasing scheme in accordance with the invention, such as the circuit shown in simplified schematic form in FIG. 2, may be used. In the circuit of FIG. 2, an AC-coupled amplified 10 is coupled between a signal input terminal $V_{IN}$ and a signal output terminal $V_{OUT}$ by coupling capacitors 12 and 14, with coupling capacitor 12 being connected between the signal input terminal $V_{IN}$ and a control terminal 16 of the amplifier, typically the base of a bipolar transistor. FIG. 2 differs from FIG. 1 in that the inductor L of FIG. 1 is replaced by an active circuit for coupling the DC voltage source $V_B$ to the control terminal 16 of the AC-coupled amplifier 10.

This active circuit includes a differential-input amplifier 18 having a frequency-dependent differential voltage gain function characteristic $G(\omega)$ that decreases as a function of frequency with a noninverting input (+) coupled to the DC voltage source $V_B$. The frequency at which the decrease or "roll-off" in the gain of the amplifier 18 occurs may either be determined by the inherent frequency-dependent characteristic of the amplifier, or else a desired roll-off frequency can be designed into the amplifier, such as by the inclusion of an R-C network, as will be apparent to those of ordinary skill in this art. The output 20 of differential amplifier 18 is coupled to control terminal 16 by a resistor 22, and the control terminal is coupled to the inverting input (−) of the differential amplifier 18. This results in a negative feedback control loop containing the resistor 22. The symbol $Z_{IN}$ is used to represent the impedance of the voltage biasing circuit as seen from the control terminal 16 of the AC-coupled amplifier 10.

Figure 3:
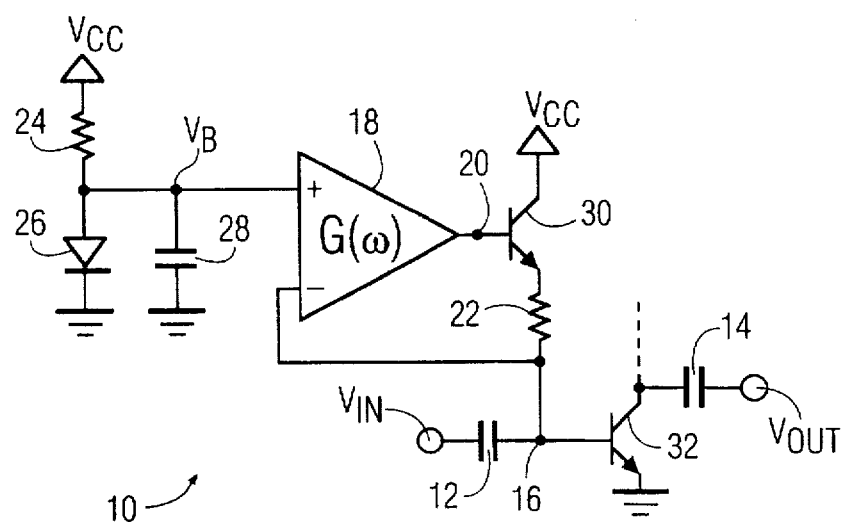
FIG. 3 shows an inductorless voltage biasing circuit in accordance with a second embodiment of the invention.

An inductorless voltage biasing circuit in accordance with a second embodiment of the invention is shown in FIG. 3. In this figure, the voltage source for providing the voltage $V_B$ includes a resistor 24 coupled between a power supply node $V_{CC}$ and $V_B$, and a diode 26 and capacitor 28 connected between $V_B$ and ground. Additionally, in this embodiment, the output 20 of differential amplifier 18 is coupled to resistor 22 by a bipolar transistor 30 having its base connected to output terminal 20, its collector connected to $V_{CC}$ and its emitter connected to resistor 22.

Additionally, FIG. 3 shows the AC-coupled amplifier 10 in simplified schematic form as comprising a bipolar transistor 32 in a common-emitter configuration with its base coupled to control terminal 16 and its collector coupled through capacitor 14 to $V_{OUT}$. It will be recognized that transistor 32 represents, in simplified form, one configuration of an AC-coupled amplifier such as an RF-amplifier stage, and that the invention is applicable to many different forms of AC-coupled amplifiers of the type requiring a bias voltage supply.

Figure 4:
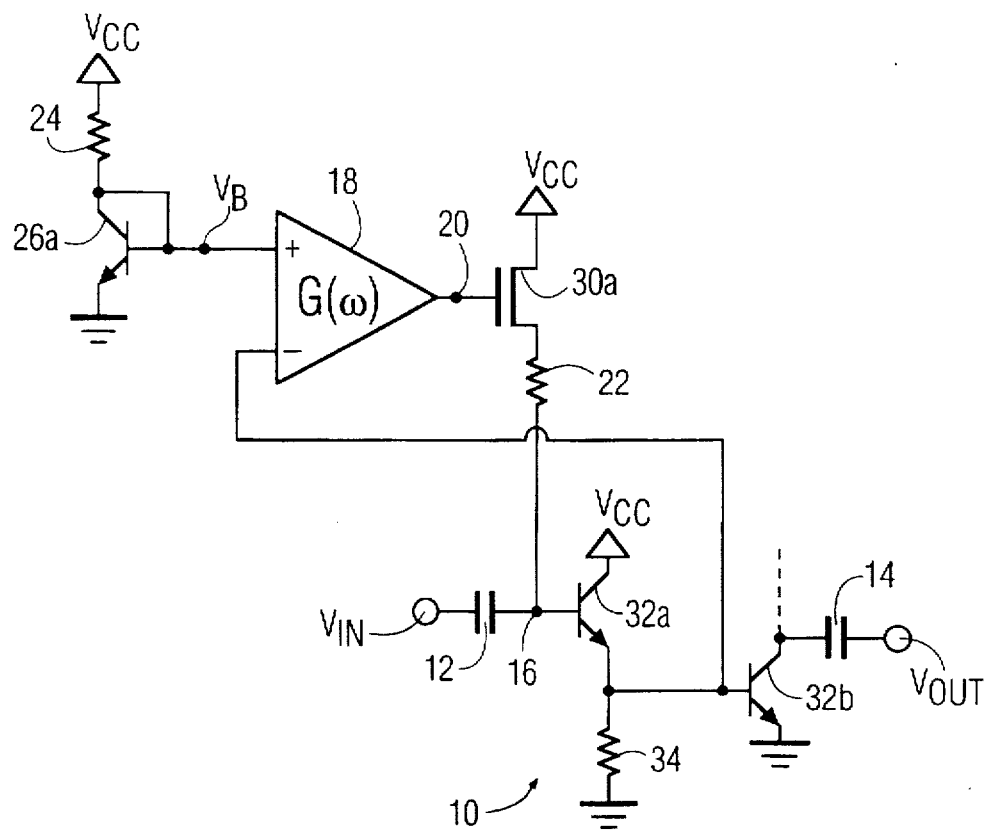
FIG. 4 shows an inductorless voltage biasing circuit in accordance with a third embodiment of the invention.

A third embodiment of an inductorless voltage biasing circuit in accordance with the invention is shown in FIG. 4. This figure shows an inductorless voltage biasing circuit suitable for use in biasing a two-stage AC-coupled amplifier, and also illustrates alternative circuit configurations for several portions of the biasing circuit. Thus, for example, in FIG. 4 the diode 26 of FIG. 3 is replaced by a diode-connected transistor 26a, which serves to generate the voltage $V_B$ in conjunction with the resistor 24 connected to $V_{CC}$. In this circuit, the temperature-dependent characteristics of transistors 26a, 32a and 32b may advantageously be matched. Additionally, the bipolar transistor 30 of FIG. 3 has been replaced by a FET 30a in a source-follower configuration, and the single-stage amplifier 10 of FIG. 3 has been replaced by a two-stage amplifier comprising bipolar transistors 32a and 32b, and resistor 34. In this embodiment, the control terminal 16 of the AC-coupled amplifier 10 is coupled to the inverting input of the differential-input amplifier 18 by the base-emitter path of transistor 32a. It should be understood that FIG. 4 shows one illustrative configuration of a two-stage amplifier, and that other configurations, such as FET amplifier stages, may be employed.

As noted above, prior-art voltage-mode biasing schemes such as the one shown in FIG. 1 use an inductor to couple a voltage source to an AC-coupled amplifier in a manner that provides a low impedance connection at DC along with a relatively high impedance in the operating frequency range of the circuit. This permits the DC bias voltage component to be coupled in a loss-free manner to the amplifier, while the amplifier is not loaded down by the biasing circuitry in the operating frequency range of the amplifier. The present invention serves to perform this same function, but without the use of an inductor, thus providing a compact, economical and easily-integrated circuit configuration.

This is accomplished by replacing the inductor with a differential-input amplifier such as an operational amplifier in a feedback loop which includes at least a resistor 22. Due to the inherent (or designed in) high-frequency roll-off characteristic of the amplifier (i.e., gain is high at DC and, at a certain frequency, begins to roll off or decrease with increasing frequency) the electrical characteristics of an inductor are simulated by this circuit as explained below. The voltage biasing circuit including amplifier 18 and the feedback connection including resistor 22 provides an impedance $Z_{IN}$ at the control terminal 16 of the AC-coupled amplifier (see, for example, FIG. 2) which is close to zero at DC, where the gain of the amplifier is large. At high frequencies, in the operating frequency range of the AC-coupled amplifier, the gain of the differential-input amplifier 18 will approach zero, thus essentially severing the feedback loop and increasing the effective impedance $Z_{IN}$ of the voltage biasing circuitry to at least the value of the resistance of resistor 22. By selecting a suitably high value for the resistor R, typically over 100 ohms, it can be insured that the voltage biasing circuit will not load down the AC-coupled amplifier in its operating frequency range, while at the same time a low-frequency impedance (typically well under 1 ohm) is obtained, thus providing a low-impedance DC path for coupling the voltage source to the control terminal of the AC-coupled amplifier. In this manner, the advantages of a voltage-mode inductively-coupled biasing scheme are obtained without the use of an inductor.

While the invention has been particularly shown and described with reference to several preferred embodiments thereof, it will be understood by those skilled in the art that various changes in form and detail may be made without departing from the spirit or scope of the invention. Thus, for example, differential-input amplifier 18 may be of any suitable type, such as an operational amplifier, and various circuit configurations may be employed for the AC-coupled amplifier 10.

What is claimed is:

1. An inductorless voltage biasing circuit for an AC-coupled amplifier, said AC-coupled amplifier comprising a signal input terminal and a coupling capacitor for coupling said signal input terminal to a control terminal of said AC-coupled amplifier, and said voltage biasing circuit comprising a voltage source coupled to said control terminal, characterized in that said voltage biasing circuit comprises a differential-input amplifier having a noninverting input coupled to said voltage source, an inverting input, an output terminal and a differential voltage gain characteristic that decreases as a function of frequency, and a resistor coupled between said inverting input and said output terminal, and in that said control terminal is coupled to said inverting input.

2. An inductorless voltage biasing circuit for an AC-coupled amplifier as in claim 1, wherein said resistor is coupled to said output terminal by a base-emitter path of a bipolar transistor.

3. An inductorless voltage biasing circuit for an AC-coupled amplifier as in claim 1, wherein said resistor is coupled to said output terminal by field effect transistor.

4. An inductorless voltage biasing circuit for an AC-coupled amplifier as in claim 1, wherein said control terminal is coupled to said inverting input by a transistor.

5. An inductorless voltage biasing circuit for an AC-coupled amplifier as in claim 1, wherein said control terminal is coupled to said inverting input by a base-emitter path of a bipolar transistor.

6. An inductorless voltage biasing circuit for an AC-coupled amplifier as in claim 1, wherein said voltage source comprises a series connection of a resistor and a diode.

7. An inductorless voltage biasing circuit for an AC-coupled amplifier as in claim 6, wherein said diode comprises a diode-connected bipolar transistor.

8. An inductorless voltage biasing circuit for an AC-coupled amplifier, said AC-coupled amplifier having a signal input terminal and a coupling capacitor for coupling said signal input terminal to a control terminal of the AC-coupled amplifier, said voltage biasing circuit comprising a bias amplifier having a voltage gain characteristic that decreases as a function of frequency for coupling a voltage source to said control terminal through a resistor and a feedback connection from said control terminal directly to an inventing input of said bias amplifier.

* * * * *